(12) United States Patent
Mujcinovic

(10) Patent No.: US 10,342,119 B1
(45) Date of Patent: Jul. 2, 2019

(54) THERMAL SPRING FRAME AND SHIELD FOR SEALED PROCESSING SYSTEMS

(71) Applicant: NIO USA, Inc., San Jose, CA (US)

(72) Inventor: Nermin Mujcinovic, Fremont, CA (US)

(73) Assignee: NIO USA, Inc., San Jose, CA (US)

( * ) Notice: Subject to any disclaimer, the term of this patent is extended or adjusted under 35 U.S.C. 154(b) by 0 days.

(21) Appl. No.: 15/937,546

(22) Filed: Mar. 27, 2018

(51) Int. Cl.
*H05K 7/02* (2006.01)
*H05K 7/04* (2006.01)
*H05K 1/02* (2006.01)
*H05K 5/06* (2006.01)
*H05K 5/00* (2006.01)

(52) U.S. Cl.
CPC ......... *H05K 1/0271* (2013.01); *H05K 1/0204* (2013.01); *H05K 5/0004* (2013.01); *H05K 5/069* (2013.01); *H05K 2201/10371* (2013.01)

(58) Field of Classification Search
CPC .. H01K 1/0271; H05K 1/0204; H05K 5/0004; H05K 5/069; H05K 2201/10371
USPC ................................................ 361/809–810
See application file for complete search history.

(56) References Cited

U.S. PATENT DOCUMENTS

| | | | | |
|---|---|---|---|---|
| 5,999,416 | A * | 12/1999 | McAnally | H05K 9/0049 174/372 |
| 6,583,986 | B1 * | 6/2003 | Storti | H05K 5/026 165/185 |
| 7,675,167 | B2 * | 3/2010 | Schlomann | H01L 23/4006 257/704 |
| 9,209,107 | B2 * | 12/2015 | Kuroda | G02F 1/133308 |

* cited by examiner

*Primary Examiner* — Hung S. Bui
(74) *Attorney, Agent, or Firm* — Sheridan Ross P.C.

(57) ABSTRACT

A compliant electronics assembly mount frame and package are provided. The compliant frame may include a number of spring features configured to flexibly maintain and/or orient an attached PCBA inside a thermal conduction package. These spring features disposed in the compliant frame may be shaped, sized, and even tuned, to bias heat generating components attached to the PCBA evenly against a thermally controlled surface of the thermal package. The frame may be made or stamped from metal, such as sheet metal, and may be formed to include one or more integral spring features.

20 Claims, 7 Drawing Sheets

THERMAL SPRING FRAME AND SHIELD FOR SEALED PROCESSING SYSTEMS

FIELD

The present disclosure is generally directed to electronics packaging, in particular, toward compliant frame and shielding for packaging electronic component assemblies.

BACKGROUND

Most electronic devices generate heat while in use. This heat is typically generated by the flow of electric current through one or more resistive elements and/or components in the electronic device. When the heat generated by these elements and/or components is not efficiently removed, the temperatures of an electronic device can exceed a normal operating range. Operating electronics at temperatures outside of the normal operating range, even periodically, can cause premature failures and result in shorter component life spans.

The efficient thermal management of electronic components and devices generally requires one or more active and/or passive cooling elements. For example, typical microprocessors may generate heat that can be removed or dissipated via an attached heat sink and/or some other cooling element/system, such as a fan, directed cooled air, fluid cooling, etc. In this example, the heat generated may be routed to, and/or dissipated, into an environment immediately surrounding the microprocessors.

However, the options for removing heat from an electronic device within a sealed environment (e.g., hermetic package, pseudo-hermetic package, sealed enclosure, etc.) may be limited to those approaches employing costly, sizable, and/or complex cooling systems.

In addition, modern electronic component assemblies, such as printed circuit board assemblies (PCBAs), may include multiple heat generating elements (e.g., microprocessors, chips, etc.) and/or thermal interfaces on a printed circuit board (PCB), or other circuit substrate. Manufacturing these assemblies generally requires a physical attachment of electronic components via some form of soldering and/or adhesion. As the solder joints in an assembly set (e.g., from a fluid form to solid form) the dimensional tolerances between assemblies may differ significantly and/or stack up on a particular assembly. Dealing with these tolerance issues in a conventional manner generally involves time consuming assembly, costly manufacturing techniques, or an overly-stressed number of components on an assembly (e.g., PCBA) to ensure intimate contact with cooling surfaces in a package.

DETAILED DESCRIPTION

Figure 1A:
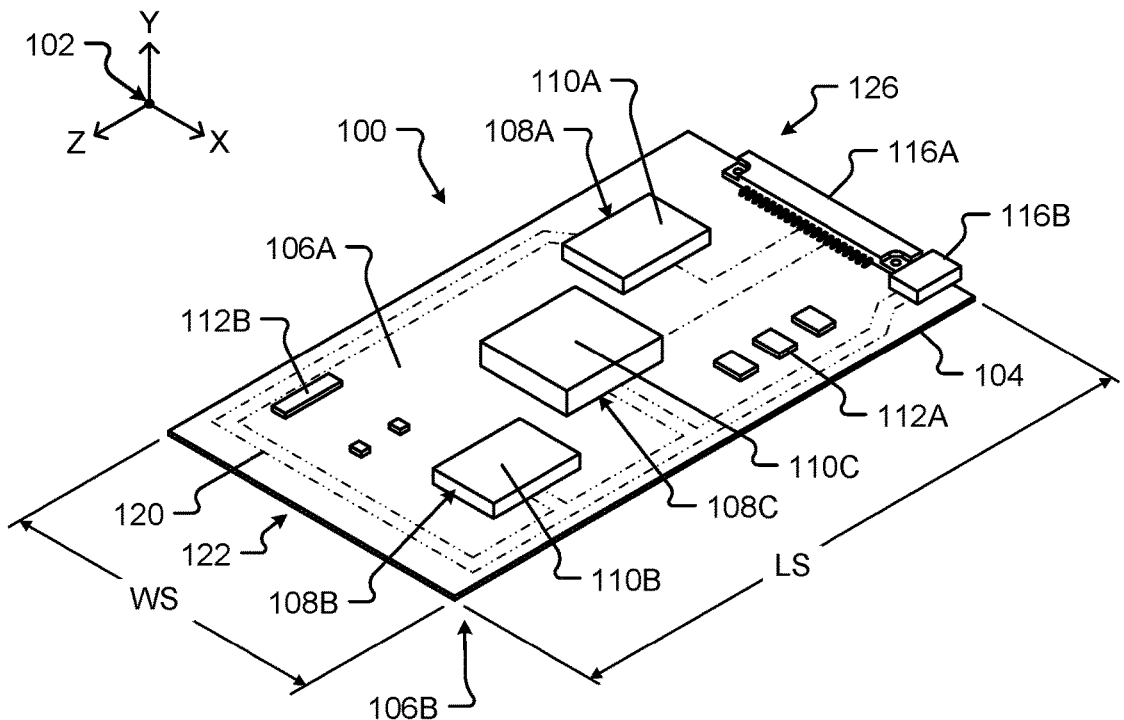
FIG. 1A shows a top perspective view of a printed circuit board assembly in accordance with embodiments of the present disclosure.

Embodiments of the present disclosure will be described in connection with electronics packaging, and in some embodiments, the construction, structure, and arrangement of elements making up a thermal spring frame and shield for sealed processing systems and packages.

In some embodiments, the present disclosure describes a frame, upon which a printed circuit board assembly (PCBA) may be mounted. The frame may include a number of spring features configured to flexibly maintain and/or orient the PCBA inside a thermal package while simultaneously biasing the heat generating components attached to the PCBA evenly against a thermally controlled surface of the thermal package. The frame may be made or stamped from metal (e.g., sheet metal, etc.) and may be formed to include the spring features.

Among other things, the present frame can serve to mitigate the tolerance stack-up issues that occur between heat generating elements (e.g., microprocessors, chips, etc.) and the heat exchange device (cooling device). Additionally or alternatively, the frame provides an economical approach to providing reliable assembly and cooling while also providing an electromagnetic interference/radio frequency interference (EMI/RFI) shield for the electronic components on the PCBA. Efficiently and predictably controlling the transfer of heat from one or more elements on a PCBA requires a consistent pressure between each chip, thermal interface material, and a cooling device (e.g., via a thermally conductive path). This consistent pressure can be achieved via "tuning" one or more of the spring features (e.g., assembly spring features, localized force spring, etc.) in the frame. It is an aspect of the present disclosure that the spring features may be tuned individually (e.g., with each spring having a specific spring constant, preformed deflection distance or percentage, and/or including machined/formed flexures to prevent over-stressing, etc.) to match a desired applied pressure holding the PCBA against a cooling interface of the sealed processing system package. In some embodiments, this tuning may be based on the dimensions of the components making up a PCBA, the sealed processing system package, etc., and/or a combination thereof.

In some cases, the formed portions of the frame may include a number of local force directors (e.g., localized force springs, etc.) that are built into (e.g., integrally formed from) the frame and configured to bias a particular component area, zone, or point of the PCBA against a specific thermally controlled surface.

As described herein, the frame may be held in place by a package lid/cover and/or a package base. In some embodiments, the size of conventional thermally conductive interfaces (e.g., thermal interface material (TIM), thermally conductive paste, contact pads, etc.) may be significantly reduced using the thermal spring frame because, among other things, the tolerance differences in the PCBA and package may be taken up by the compliant spring features of the frame.

In one embodiment, and in addition to providing a flexible PCBA attachment in a thermally controlled package, the frame may be made from metal. The metal structure of the frame may be configured to substantially cover or shield various components (e.g., microprocessors, communications components, electronics, etc.) disposed on the PCBA. This arrangement of the metal frame can serve to shield the electronics of the PCBA from radio frequency (RF) and/or electromagnetic (EM) interference.

In this case, at least some of the materials of the package do not need to be made from metal, and as such, more economical material selections (e.g., plastic, carbon fiber, fiberglass, composites, etc.) may be used to make up one or more areas (e.g., the lid/cover, etc.) of the package. In other words, the materials selected for the package are not restricted to conventional EMI/RFI shielding solutions and materials. Additionally, these new package materials may offer reduced weight, electrical insulation, and/or manufacturing (e.g., molding, etc.) advantages above and beyond those offered by conventional metal packages.

As can be appreciated, the compliant package described herein can provide an efficient cooling of multi-surface electronics equipment in a hermetic, sealed environment, and/or package. Further, due in part to the compliant nature of the spring features maintaining the PCBA inside the package, the package may be resistant to shock, vibration, thermal changes, etc., and/or combinations thereof. The embodiments disclosed herein provide a frame and package that is capable of being installed in any environment or area of a vehicle, machine, system, etc.

Figure 1B:
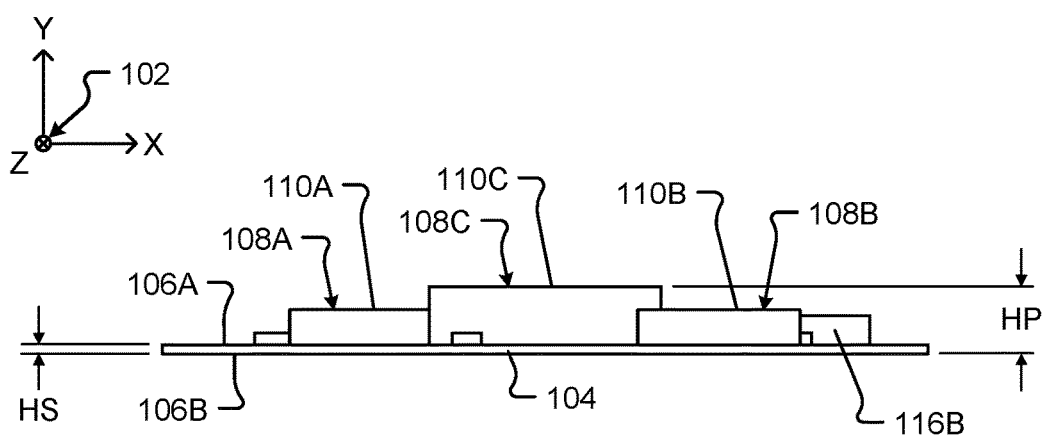
FIG. 1B shows a front elevation view of the printed circuit board assembly of FIG. 1A.

Referring to FIGS. 1A and 1B, various views of a printed circuit board assembly (PCBA) 100 are shown in accordance with embodiments of the present disclosure. In some embodiments, the features of the PCBA 100 may be described with reference to one or more axes (e.g., X-axis, Y-axis, Z-axis), or planes (e.g., XZ-plane, XY-plane, YZ-plane) of the coordinate system 102 shown. As shown, the PCBA 100 may include a substantially planar substrate 104 having a length, LS, running from a first end 122 to a second end 126 of the substrate 104. This length, LS, and a width, WS, of the substrate 104 may define at least one substantially planar component mounting surface 106A, 106B disposed on the first side and/or second side of the substrate 104. The first surface 106A of the substrate 104 may be separated from the second surface 106B of the substrate 104 by a thickness, or height, HS, corresponding to one or more layers of material making up the substrate 104. In some embodiments, the length, LS, and width, WS, of the substrate 104 may correspond to the overall length and width of the PCBA 100. The height, HS, of the substrate 104, however, may differ from the height, HP, of the PCBA 100. For example, the height, HP, of the PCBA may include an overall height of the components attached, soldered, fused, and/or protruding from one or more surfaces 106A, 106B of the PCBA 100 in addition to the height, HS, of the substrate 100.

In some embodiments, the substrate 104 may correspond to a printed circuit board (PCB). In one embodiment, the substrate 104 may include one or more layers of dielectric material and at least one layer disposed thereon including electrically conductive traces 120 configured to electrically interconnect electronic components of the PCBA 100. The traces 120 may run from one or more legs, contacts, or pins associated with passive electronic components (e.g., resistors, capacitors, diodes, transformers, etc.) and/or active electronic components (e.g., transistors, processors, application specific integrated circuit (ASIC), microprocessors, and/or other components configured to actively control electron flow, etc.) to one or more other components, connectors, and/or ground features associated with the PCBA 100. In some embodiments, the traces 120 may pass from a first surface 106A or side of the PCBA 100 to a second surface 106B or side of the PCBA 100.

The substrate 104 may be made from rigid material configured to mechanically support the electronic components. Examples of the rigid materials may include, but are in no way limited to, fiberglass, linen, ceramic, glass, resin, epoxy, phenolic cotton paper, woven fiberglass cloth, glass and polyester, paper and epoxy, insulated metal, polymer, polyimide, polytetrafluoroethylene, etc., and/or combinations thereof. The electrically conductive traces 120 of the substrate 104 may be machined, stamped, cut, etched, deposited, and/or otherwise formed from a conductive material. Examples of conductive materials may include, but are in no way limited to, copper, silver, gold, aluminum, graphene, etc., and/or other metals. For clarity of description, a limited number of traces 120 are shown in FIG. 1A.

As shown in FIGS. 1A and 1B, the PCBA 100 may include a number of heat generating elements 108A-C, including at least one surface 110A-C from which heat may be transferred and/or emitted. The heat generating elements 108A-C may correspond to passive or active electronic components. In one embodiment, the heat generating elements 108A-C may be microprocessors, processors, and/or integrated circuits. The heat generating elements 108A-C may be attached to a first surface 106A of the substrate 104 via surface mount and/or through-hole mount soldering and/or via at least one adhesive layer disposed between the heat generating elements 108A-C and the first surface 106A. In some embodiments, the second surface 106B may include one or more mounting features, solder pads, and/or frame attachment surfaces. In any event, the first surface 106A may be disposed opposite the second surface 106B, or vice versa, separated by a material or substrate thickness, HS.

In addition to one or more heat generating elements 108A-C, the PCBA 100 may include other electronic components 112A, 112B, connectors 116A, 116B, electrical contacts, and/or mechanical features. The connectors 116A, 116B may correspond to communications connectors, power connectors, and/or a combination of communications and power connectors. In some embodiments, the connectors 116A, 116B may be disposed at the same end 126 of the substrate 104 or PCBA 100. Among other things, locating the connectors 116A, 116B at the same end 126 of the PCBA 100 allows a single end of the package to house the mating connections and/or passthrough electrical interconnections from an interior of the sealed or enclosed package to an exterior of the sealed or enclosed package.

In some embodiments, the PCBA 100 may include a plurality of heat generating elements 108A-C disposed on a first side or surface 106A of the substrate 104. FIG. 1B shows first, second, and third heat generating elements 108A-C disposed on the first surface 106A of the substrate. As shown in FIG. 1B, the heat generating elements 108A-C may have similar or different heights extending outwardly from the first surface 106A of the substrate 104. These heights may be measured between the first surface 106A and the heat emitting surface 110A-C of the respective heat generating element 108A-C. The overall height, HP, of the PCBA 100 may be measured between points of the PCBA 100 that are disposed furthest from the substrate 104 (e.g., extending outwardly along the Y-axis). For example, the third heat generating element 108C is the tallest electronic component attached to the first surface 106A. In this example, the overall height, HP, of the PCBA 100 may be measured from the heat emitting surface 110C of the third heat generating element 108C to the second surface 106B of the PCBA 100. The heat emitting surfaces 110A-C of the heat generating elements 108A-C may be substantially planar and/or substantially parallel to the first and/or second surfaces 106A, 106B of the substrate 104.

Figure 2A:
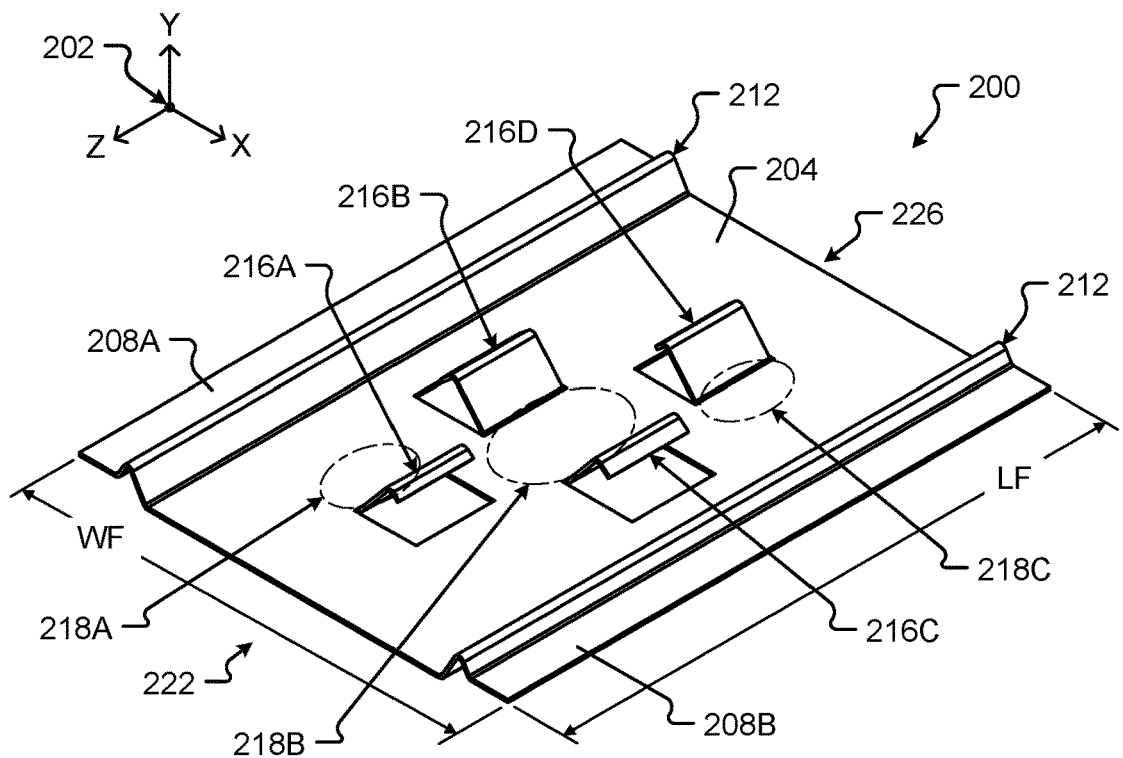
FIG. 2A shows a perspective view of a sealed processing system spring frame in accordance with embodiments of the present disclosure.

FIG. 2A shows a perspective view of a compliant electronics assembly mount frame 200 in accordance with embodiments of the present disclosure. In some embodiments, the features of the frame 200 may be described with reference to one or more axes (e.g., X-axis, Y-axis, Z-axis), or planes (e.g., XZ-plane, XY-plane, YZ-plane) of the coordinate system 202 shown. The frame 200 may comprise a substrate including a substantially planar electronics assembly mount area 204 disposed inside an overall width, WF, and length, LF, of the frame 200. The mount area 204 may be substantially disposed at a center of the frame 200. The frame 200 may include one or more suspension, or mount, flanges 208A, 208B integrally formed in the substrate and disposed along opposing edges of the frame 200. In some embodiments, the mount flanges 208A, 208B may run from a front 222 to a rear 226 of the frame 200 (e.g., along the length, LF, of the frame 200). It is an aspect of the present disclosure, that the frame 200 and an attached PCBA 100 may be mounted to an electronics package (e.g., base, lid, housing, etc.) via the first and second mount flanges 208A, 208B. Although not shown in FIG. 2A, the mount flanges 208A, 208B may include one or more mount features, keys, tabs, slots, holes, captured fasteners, etc., and/or the like.

Figure 2B:
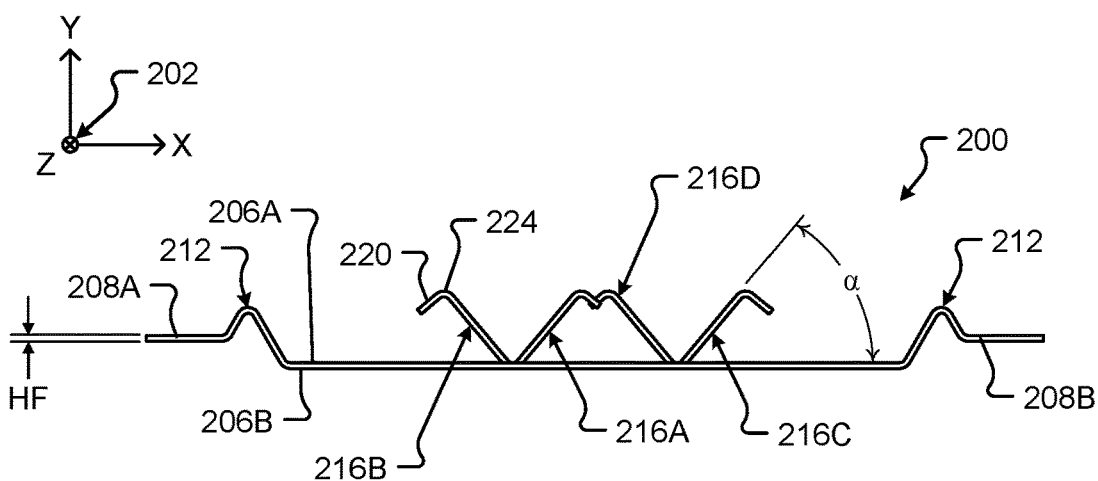
FIG. 2B shows a front elevation view of the sealed processing system spring frame of FIG. 2A in accordance with embodiments of the present disclosure.

The frame 200 may include at least one spring feature 212. The spring features 212 may be integrally formed in the substrate of the frame 200. For instance, the frame 200 may be manufactured, or made, from sheet metal, and the spring features 212 may comprise a plurality of bends that are disposed along a width, WF, of the frame 200. The spring features 212 are shown in FIGS. 2A and 2B disposed between the mount flanges 208A, 208B and the width periphery of the mount area 204. Among other things, this arrangement of the spring features 212 allows an attached PCBA 100 to be maintained in a desired position inside the electronics package. For example, the spring features 212 may bias the PCBA 100 against a thermally conductive surface of the package. In some cases, the spring features 212 may allow the frame 200 to compress and/or stretch in a direction along the X-axis, shortening and/or increasing the overall width, WF, dimension. Additionally or alternatively, the spring features 212 may allow for variation in dimensions of a finally assembled PCBA 100 held inside the package by flexing, or compliantly moving in the Y-axis direction.

Although shown as bends in the substrate extending the length, LF, of the frame 200, the spring features 212 may be interrupted, cut, relieved, or otherwise shaped. In some cases, a number of cuts may be disposed through the spring features 212 along the length, LF, to decrease and/or tune a stiffness or spring constant of each of the spring features 212. In one embodiment, where the frame 200 is made from sheet metal, the cuts may be made in the sheet metal material prior to bending and/or forming the spring features 212. In any event, the spring features 212 mechanically couple the mount flanges 208A, 208B with the mount area 204 via an integrally formed compliant joint. Various shapes of the spring features 212 are described in conjunction with FIGS. 3A-3B.

In some embodiments, the frame 200 may include a number of pressure tabs, or localized force spring features 216A-D disposed in the mount area 204 of the substrate. These localized force spring features 216A-D may comprise cut sections of the material making up the substrate that are bent in a direction away from a PCBA mount surface of the frame 200. As shown in FIGS. 2A and 2B, the localized force spring features 216A-D are shown bent at a non-zero angle, a, between a first surface 206A of the frame 200 and a portion of the localized force spring features 216A-D. Examples of the non-zero angle ranges for each of the bent localized force spring features 216A-D may include, but are in no way limited to, 1-15 degrees, 15-30 degrees, 30-60 degrees, and/or 60-80 degrees. The localized force spring features 216A-D, and/or the bends in the mount area 204 adjacent to the localized force spring features 216A-D may provide a strengthened portion of the material adjacent to a controlled area 218A-C in the mount area 204. For example, the bent localized force spring features 216A-D may provide bend-resistant reinforcement features along a length of the localized force spring features 216A-D. As shown in FIG. 2A, the localized force spring features 216A-D may provide a resistance to bending of the mount area 204 about the X-axis, maintaining rigidity in the controlled areas 218A-C at least in the XZ-plane. Additionally or alternatively, the localized force spring features 216A-D may be configured to direct compressive forces along a height or length of the localized force spring features 216A-D toward a portion of material in the mount area 204 adjacent to the bend of the localized force spring features 216A-D. These directed compressive forces may maintain one or more heat generating elements of an attached PCBA 100 in a contacting position against one or more thermal conductive surfaces of the package base.

Each of the localized force spring features 216A-D may include a flange 220 and a lid contact knee 224. The lid contact knee 224 may be configured as a bend in the localized force spring features 216A-D. This bend, or lid contact knee 224, may be designed to contact an internal surface of a package lid, biasing focused regions of the mount area 204 in a direction (e.g., in the negative Y-axis direction) toward a package base, as described herein. The frame 200 may be made from a single sheet of material (e.g., metal, etc.) having a uniform thickness, or height, HF, between first and second surfaces 206A, 206B of the substrate. It should be appreciated, however, that the frame 200 when bent or formed may have an overall thickness greater than the height, HF, of the sheet metal.

Figure 3A:
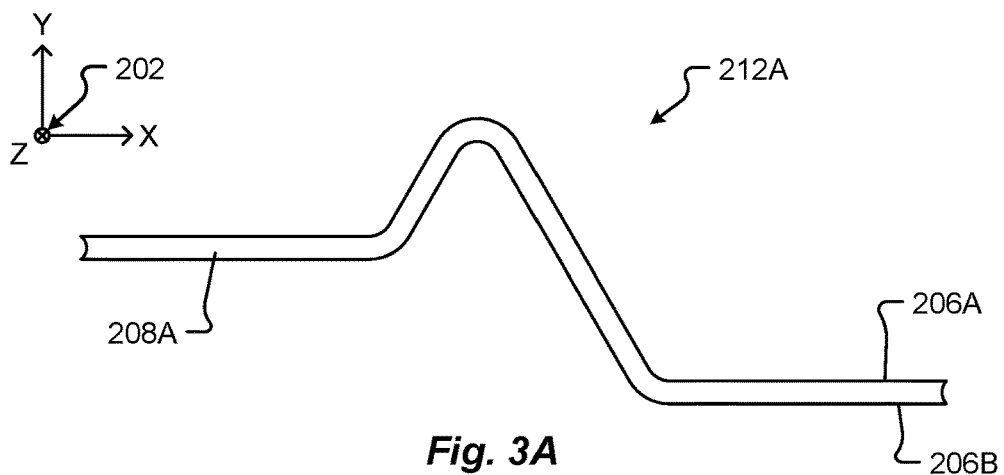
FIG. 3A shows a front detail elevation view of a spring element of sealed processing system having a first shape in accordance with embodiments of the present disclosure.
Figure 3B:
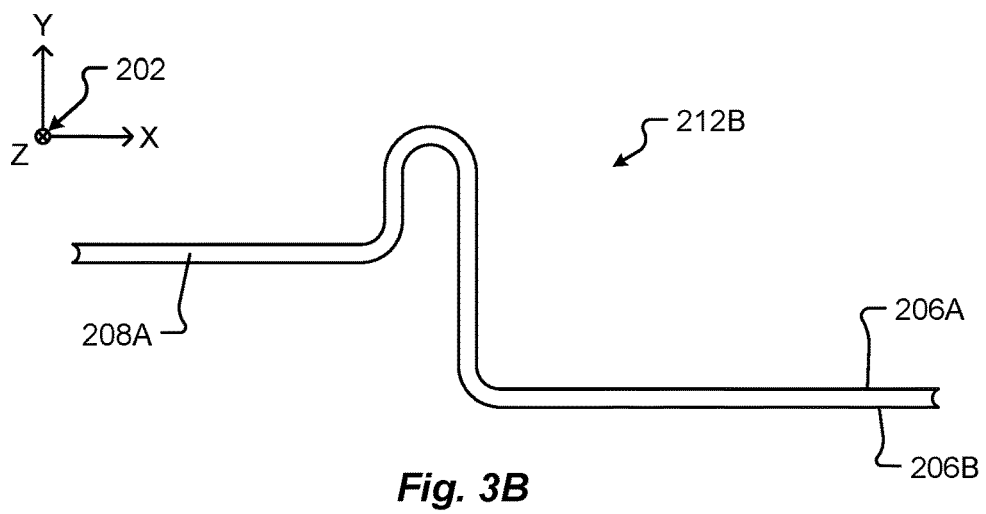
FIG. 3B shows a front detail elevation view of a spring element of sealed processing system in a second shape in accordance with embodiments of the present disclosure.
Figure 3C:
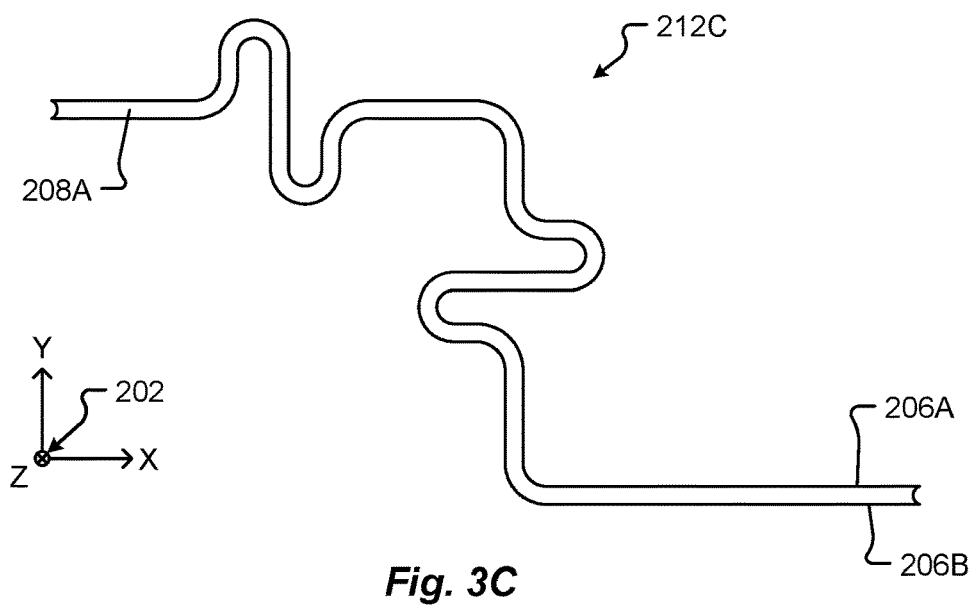
FIG. 3C shows a front detail elevation view of a spring element of sealed processing system in a third shape in accordance with embodiments of the present disclosure.

FIGS. 3A-3C show front detail elevation views of various shapes 212A-C of the spring features 212 of the frame 200 in accordance with embodiments of the present disclosure. Each of the shapes 212A-C shown may include a material thickness, HF, disposed between first and second surfaces 206A, 206B.

FIG. 3A shows a first shape 212A of a spring feature 212 of the frame 200 including three bends defining a V-shaped bend region. The V-shaped spring shape 212A may provide a spring feature 212 having substantially even compliance in both the Y-axis and the X-axis directions, where the force required to stretch and/or compress the frame 200 in the X-axis direction is substantially similar to the force required to stretch and/or compress the frame 200 in the Y-axis direction.

FIG. 3B shows a second shape 212B of a spring feature 212 of the frame 200 including three bends defining a U-shaped bend region. The U-shaped spring shape 212B may provide a spring feature 212 having more compliance along the X-axis direction and a controlled or restricted compliance in the Y-axis direction, where the force required to stretch and/or compress the frame 200 in the X-axis direction is less that the force required to stretch and/or compress the frame 200 in the Y-axis direction.

FIG. 3C shows a third shape 212C of a spring feature 212 of the frame 200 including approximately ten bends defining multiple S-shaped bend regions. The multiple S-shaped spring shape 212C shown in FIG. 3C may provide a spring feature 212 having substantially even compliance in both the Y-axis and the X-axis directions, where the force required to stretch and/or compress the frame 200 in the X-axis direction is substantially similar to the force required to stretch and/or compress the frame 200 in the Y-axis direction. In some embodiments, the multiple S-shaped spring shape 212C may provide additional mount surfaces (e.g., the surface in the XZ-plane disposed immediately after the first set of four bends, forming the first S-shape in the frame 200) for one or more additional PCBAs 100, package features, and/or isolation elements.

Figure 4A:
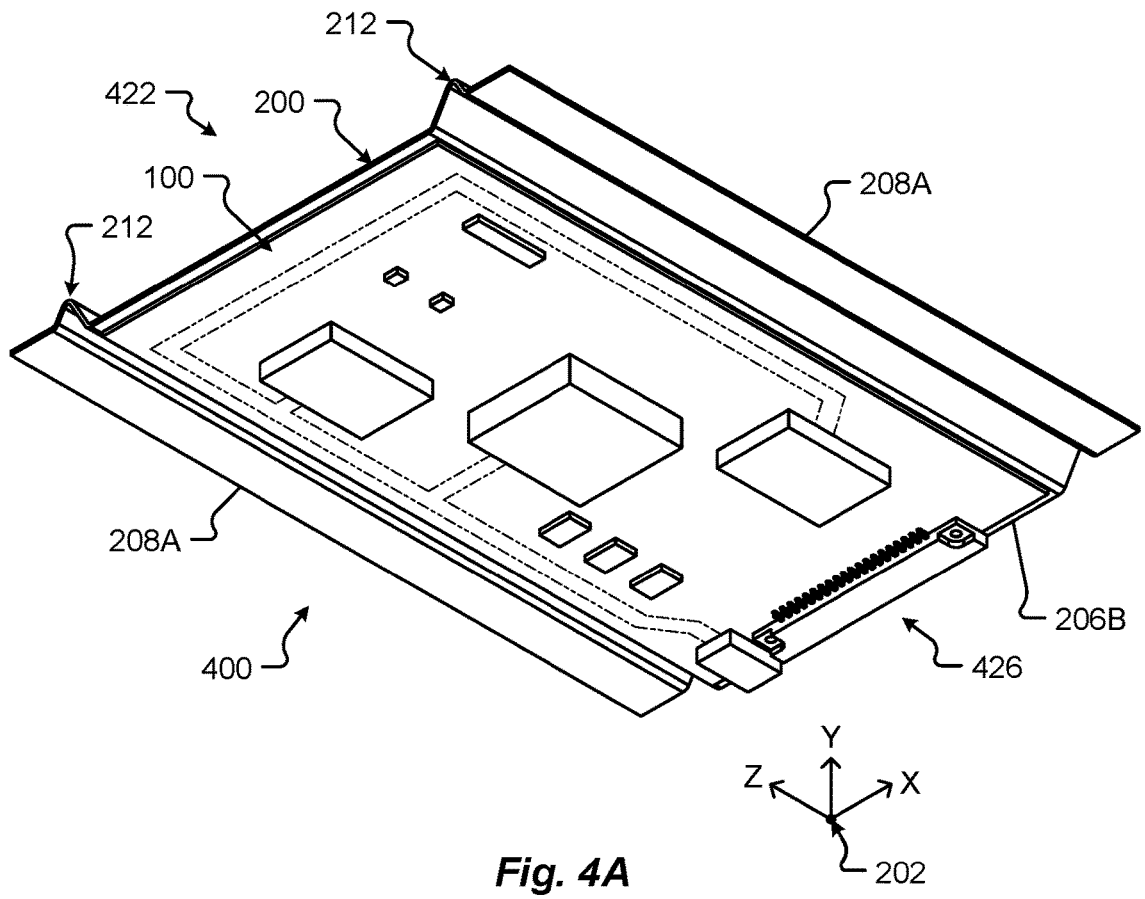
FIG. 4A shows a bottom perspective view of the sealed processing system spring frame with attached electronics assembly in accordance with embodiments of the present disclosure.

FIG. 4A shows a bottom perspective view of the frame 200 with an attached PCBA 100 forming an integrated compliant electronics frame 400 in accordance with embodiments of the present disclosure. As shown in FIG. 4A, the second surface 106B of the PCBA 100 is mechanically coupled with the second surface 206B of the frame 200. In some embodiments, the PCBA 100 may be affixed directly to the frame 200 via one or more fasteners, adhesives, tabs-and-slots, tongue-and-groove, and/or other attachment, or vice versa. In one embodiment, the frame 200 may include a number of standoffs, captured fasteners, and/or attachment interface elements to which the PCBA 100 may be mounted, or vice versa. In any event, the PCBA 100 is shown mechanically coupled to the second surface 206B and side of the frame 200, disposed between the spring features 212 and mount flanges 208A, 208B. Additionally or alternatively, the PCBA 100, and/or the PCB substrate 104, may be disposed between a front 422 and rear 426 of the integrated frame 400.

Figure 4B:
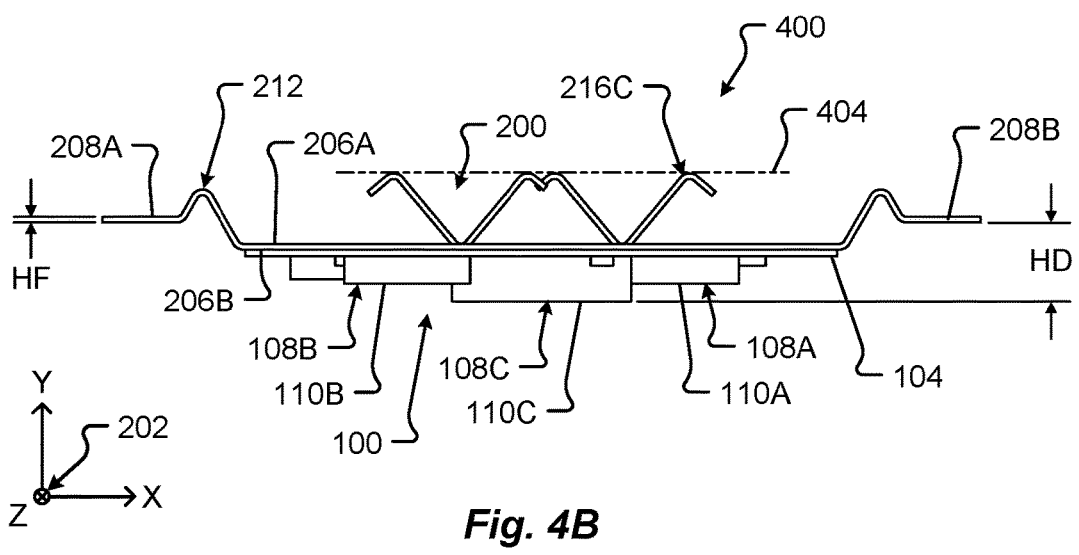
FIG. 4B shows a front elevation view of the sealed processing system spring frame with attached electronics assembly in accordance with embodiments of the present disclosure.

FIG. 4B shows a front elevation view of the integrated compliant electronics frame 400 in accordance with embodiments of the present disclosure. In FIG. 4B, the heat generating elements 108A-C are shown extending a distance from the substrate 104 and a distance from the second surface 206B of the package 200. These distances may be used to determine a height, HD, from the package mount flanges 208A, 208B to the furthest heat emitting surface 110C associated with the tallest heat generating element 108C as well as distances to the other heat emitting surfaces 110A, 110B of the other heat generating elements 108A, 108B. In some embodiments, the integrated frame 400 may be attached to a package base and the distances may be used to determine a height of a machined interface between a conduction portion of the package base and respective heat generating elements 108A-C.

In one embodiment, the localized force spring features 216A-D may be pre-formed, or shaped, as shown in FIG. 4B to provide a predetermined biasing force for the PCBA against the package base. Although each of the localized force spring features 216A-D may be bent individually (e.g., to different, or the same settings, etc.) the predetermined biasing force may be based on a dimension of the lid or cover of the package from the first surface 206A of the frame 200. In FIG. 4B, the phantom line 404 may represent the dimension at which the localized force spring features 216A-D must be bent to provide the predetermined biasing force against the interior surface of the package lid. For instance, the phantom line 404 may represent a position of the interior surface of the lid or a position above the interior surface of the lid, such that a preloaded force is applied against the PCBA 100 via the frame 200 (e.g., forcing one or more surfaces of the PCBA 100 against the package base, which may be actively cooled, etc.).

Figure 5A:
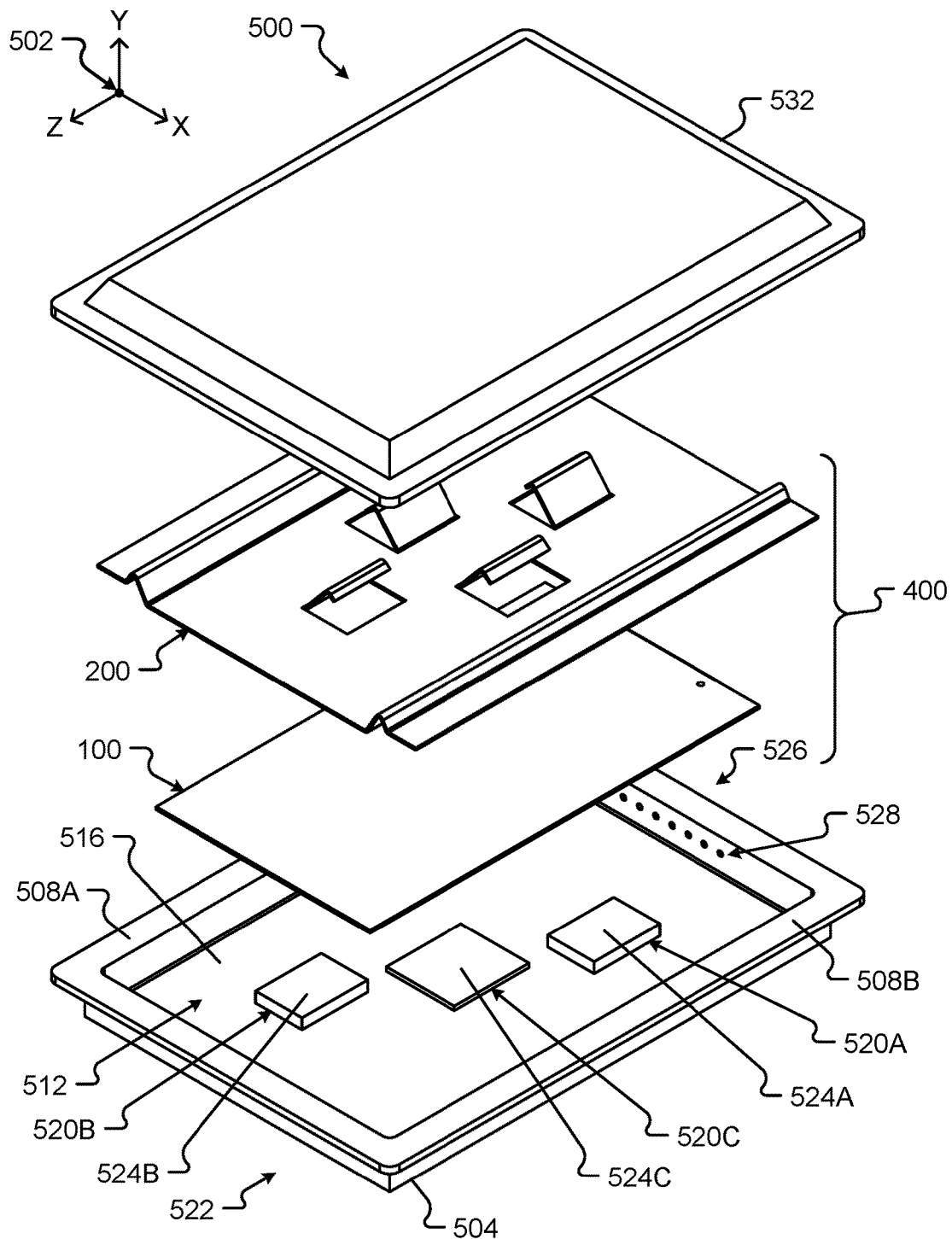
FIG. 5A shows an exploded perspective view of a sealed processing system package including a spring frame and electronics assembly in accordance with embodiments of the present disclosure.

Referring now to FIG. 5A, an exploded perspective view of a sealed processing system package 500 including the integrated compliant electronics frame 400 (e.g., the frame 200 and PCBA 100, etc.) is shown in accordance with embodiments of the present disclosure. The complete sealed processing system package 500 may include a package base 504, an integrated compliant electronics frame 400 including the compliant frame 200 and the PCBA 100, and a package lid 532. In some embodiments, the integrated compliant electronics frame 400 and, more specifically, the compliant frame 200 may be captured between the package base 504 and the package lid 532. In one embodiment, a seal or gasket (not shown) may be disposed between the package base 504 and the package lid 532. The seal or gasket may be made from a compliant material (e.g., rubber, silicone, polymers, etc.) in the shape of an O-ring, flat gasket, X-ring, and/or any other shape that is configured to compress between surfaces of the package base 504 and the package lid 532 providing a sealed environment inside the package 500. In one embodiment, the seal or gasket may be a soft material (e.g., copper, etc.) that is configured to displace around a harder surface and/or edge pressed into the soft material. Although not shown, the package lid 532 may be fastened to the package base 504 with one or more fasteners (e.g., disposed around the peripheral edge of the flanged surfaces of the package 500, etc.). In some cases, the package lid 532 may be attached to the package base 504 via one or more adhesive, brazed surface and/or joint, welded surface and/or joint (e.g., ultrasonically, laser, etc.), clamped portion, etc., and/or combinations thereof.

The package base 504 may include a baseplate 516 and a number of walls disposed at a periphery of the baseplate 516. The walls may extend outwardly from the baseplate 516 and form (e.g., at a terminating end of the walls, etc.) at least one mount surface 508A, 508B that is offset from a surface of the baseplate 516. In some embodiments, the mount flanges 208A, 208B of the package 200 may be attached, and/or forced into contact with, the mount surfaces 508A, 508B, respectively. In one embodiment, the mount surfaces 508A, 508B may extend around a complete periphery of the package base 504 (e.g., around the periphery of the walls of the package base 504, etc.). Corresponding mating surfaces may be disposed around a periphery of the package lid 532 and configured to mate, attach, or otherwise contact the mount surfaces 508A, 508B of the package base 504. As provided above, the mount surfaces 508A, 508B may comprise a sealing gasket or material disposed, deposited, or formed thereon. In this case, the mating surfaces of the package lid 532 may contact the sealing gasket or material of the mount surfaces 508A, 508B, sealing an environment inside the package 500 from an environment outside the package 500.

In some embodiments, the package base 504 may include a number of thermally conductive pads 520A-C, machined or otherwise formed in the baseplate 516. The thermally conductive pads 520A-C may provide a thermally conductive path from an inside space 512 of the package base 504 to an outside of the package base 504 (e.g., an outside of the baseplate 516, and/or some other surface of the package base 504 outside of the inside space 512, etc.). In particular, the thermally conductive pads 520A-C may include a number of thermally conductive surfaces 524A-C designed to thermally interconnect (e.g., conductively attach) with the heat emitting surfaces 110A-C of the heat generating elements 108A-C of the PCBA 100. The thermally conductive pads 520A-C may be machined or formed at various distances from the baseplate 516 to take up a dimension between the heat generating elements 108A-C and the baseplate 516. The thermal interconnection may include a thermal interface material (TIM) disposed between the thermally conductive surfaces 524A-C and the heat emitting surfaces 110A-C of the heat generating elements 108A-C of the PCBA 100. The TIM may be a thermally conductive grease, tape, adhesive, or other thin material configured to provide an effective thermal path (e.g., a thermal coupling, etc.) between the heat generating elements 108A-C of the PCBA 100 and the outside of the package 500.

Although not shown, the package base 504 may include a number of heat sink elements configured to transfer thermal energy from a surface of the body to an environment surrounding the body. The heat sink elements may be configured as straight fins, protrusions, pins, flared fins, etc., and/or combinations thereof. In some embodiments, the heat sink elements may extend along a length of the package 500, for example, from the front 522 to the rear 526 of the package 500.

It is an aspect of the present disclosure that the bottom of the baseplate 516 and/or package 500 may be thermally controlled via an attachment to a cooling plate. The cooling plate may controlled to selectively cool one or more outer surfaces of the package 500. As described herein, the heat generating elements 108A-C may be held in intimate thermal contact with the thermally conductive pads 520A-C of the package base 504. As the heat generating elements 108A-C generate heat, the heat may pass from the heat emitting surfaces 110A-C of the heat generating elements 108A-C of the PCBA 100 in contact (e.g., thermal contact) with the thermally conductive surfaces 524A-C through the thermally conductive pads 520A-C to the outer surfaces of the package 500 where the heat can be dissipated and/or cooled via the attached cooling plate.

In some embodiments, the package base 504 and/or package lid 532 may include a number of connectors, electrical interconnections, or other interconnection features 528 or passthroughs formed in a portion thereof. As shown in FIG. 5A, these interconnection features 528 are disposed in the package base 504 (e.g., in at least one wall of the package base 504, etc.). In one embodiment, the connectors 116A, 116B of the PCBA 100 may be interconnected with one or more of these interconnection features 528 providing a conductive path for one or more of communication and power between the inside 512 of the sealed package 500 and the outside of the package 500. As shown in FIG. 5A, the wall of the package 500 disposed at the rear 526 may include a series of interconnection features 528 configured as a series of small sealed connectors, pins, and/or sealable passthroughs. In some embodiments, the sealed connectors may be configured as one or more conductive pins disposed in respective holes of the package base 504, where the hole is filled with a potting material. In one embodiment, the pins may be surrounded by glass forming a glass to metal seal between the pins and the holes in the package base 504. In some cases, a pseudo-hermetic seal may be achieved via a passthrough connector disposed in an opening, aperture, or hole in the package base 504, where the passthrough connector is sealed in the opening, aperture, or hole by one or more gaskets and/or O-rings. The completed sealed processing system package 500 with integrated electronics 400 is shown in the perspective view of FIG. 5B.

The components of the package 500 may be made from plastic, metal, carbon fiber, linen, composites, epoxy resin, etc., and/or combinations thereof. In one embodiment, the material of one or more components of the package 500 may be thermally conductive. Thermally conductive material may provide a thermal path from an interior space 512 of the package 500 to an environment outside the package 500. This thermal path may serve as the path by which heat can be transferred from electronics contained inside the package 500. Examples of thermally conductive materials may include, but are in no way limited to, steel, titanium, aluminum, copper, tin, nickel, iron, etc., alloys thereof, and/or combinations thereof. The components of the package 500 may be machined, formed, molded, cast, extruded, etc., and/or combinations thereof. It is an aspect of the present disclosure that the package base 504 may be made from a metal, or metallic, thermally conductive material and the package lid 532 may be made from a nonmetallic material. For instance, the package lid 532 may be machined, molded, or otherwise formed from plastic or other non-metals. Because the frame 200 serves as an electromagnetic (EM) and/or radio frequency (RF) interference shield disposed between the PCBA 100 and the package lid 532 in the package 500, there is no need to manufacture the package lid 532 from an EM or RF blocking material (e.g., metal, metal infused, etc.). Among other things, manufacturing the package lid 532 from a plastic and/or moldable material can significantly reduce the cost of the package 500 and even decrease the weight of the package 500 when compared to conventional "all metal" housing packages (e.g., the conventional housing packages requiring timely and costly machining operations and weighing more than plastic or other non-metals, etc.).

Figure 5B:
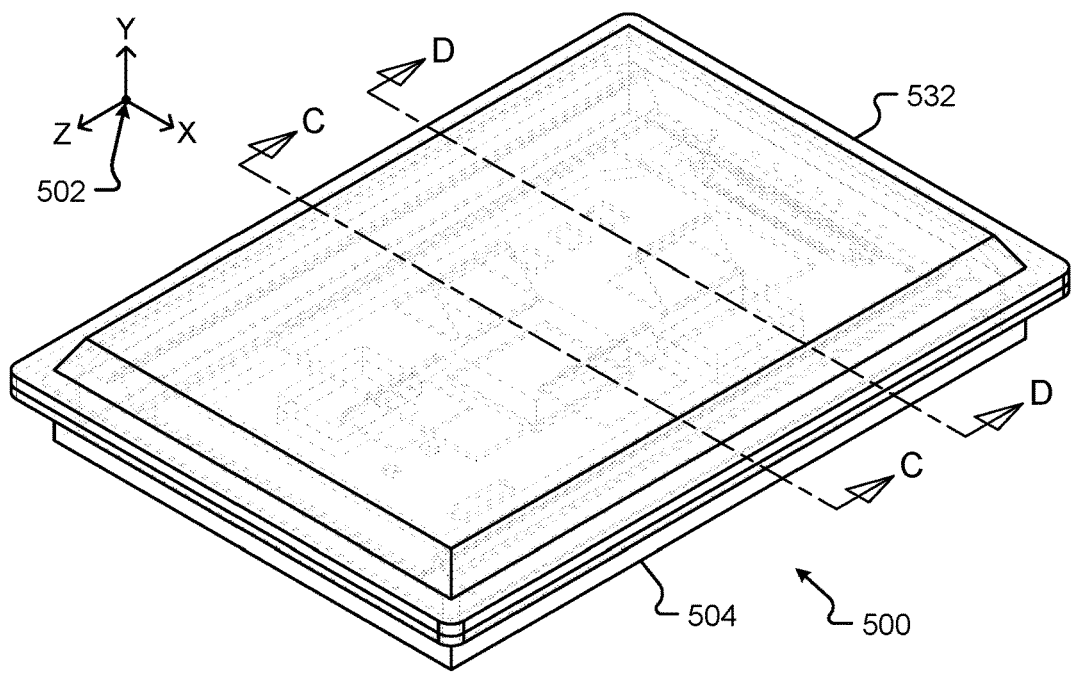
FIG. 5B shows a perspective view of the sealed processing system package including a spring frame and electronics assembly of FIG. 5A in accordance with embodiments of the present disclosure.

As provided above, FIG. 5B shows a perspective view of the sealed processing system package 500 in accordance with embodiments of the present disclosure. In FIG. 5B, two different section lines are shown at various points along the length of the package 500. Line C-C is taken through a center of the package 500 in the XY-plane, and line D-D is taken through a portion of the package 500 also in the XY-plane and offset a distance from line C-C.

Figure 5C:
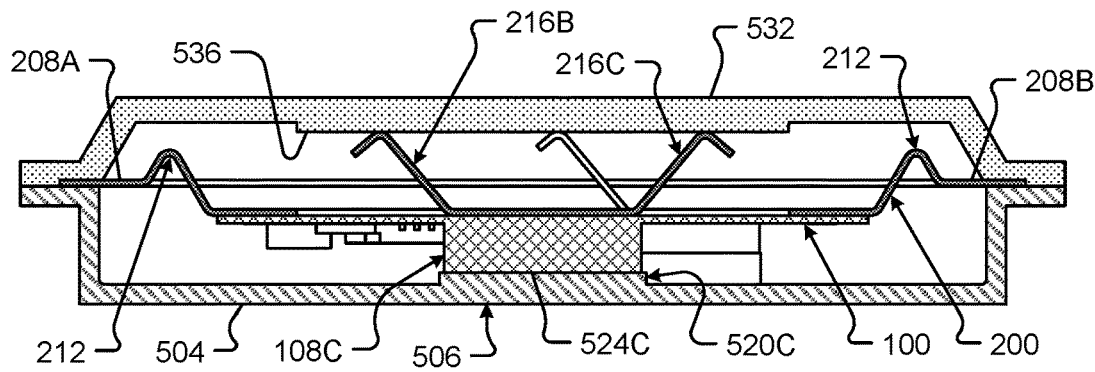
FIG. 5C shows a first section view taken through the package at line C-C of the perspective view shown in FIG. 5B.

In the first section view, of FIG. 5C, taken through the package 500 at line C-C of the perspective view shown in FIG. 5B, the frame 200 is shown including two localized force spring features 216B, 216C disposed on either side of the third heat generating element 108C of the PCBA 100. As shown in FIG. 5C, the heat emitting surface 110C of the third heat generating element 108C is shown in thermal contact with the thermally conductive surface 524C of the third thermally conductive pad 520C. In fact, the spring features 212 may bias the entire PCBA 100 in a direction toward the baseplate 516 of the package base 504. Additionally or alternatively, the two localized force spring features 216B, 216C disposed on either side of the third heat generating element 108C of the PCBA 100 may provide additional downward force (e.g., force acting in the negative Y-axis direction, etc.). For example, the lid contact knee 224 may contact the internal surface 536 of the package lid 532, causing the two localized force spring features 216B, 216C to flex applying a force against the third heat generating element 108C and maintaining the heat emitting surface 110C in thermal contact with the thermally conductive surface 524C of the third thermally conductive pad 520C. In some embodiments, a TIM may be disposed between the heat emitting surface 110C and the thermally conductive surface 524C. In one embodiment, the thermally conductive surface 524C and/or the heat emitting surface 110C may include the TIM. The pressure applied by the localized force spring features 216B, 216C may be fine-tuned via bending the features 216B, 216C at different angles and/or via including a built up feature, shim, or other interstitial mechanical element disposed between the lid contact knee 224 of the localized force spring features 216B, 216C and the internal surface 536 of the package lid 532 (e.g., increasing the displacement of, and force applied by, the spring features 216B, 216C, etc.).

Figure 5D:
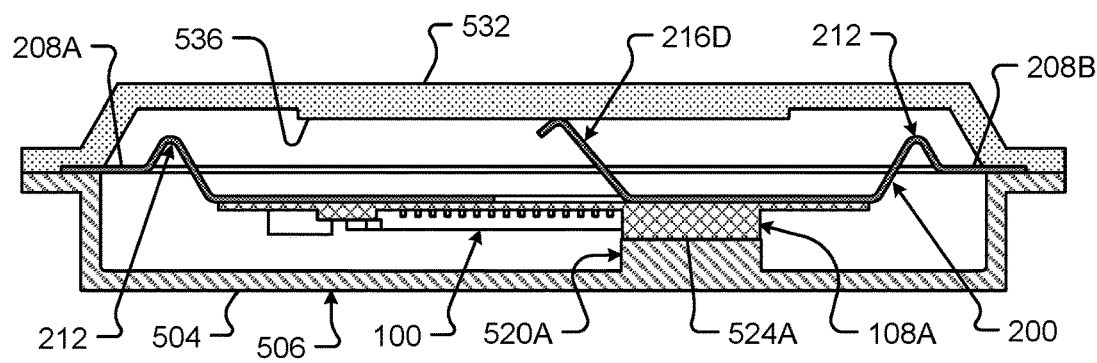
FIG. 5D shows a second section view taken through the package at line D-D of the perspective view shown in FIG. 5B.

FIG. 5D shows a second section view taken through the package 500 at line D-D of the perspective view shown in FIG. 5B. In FIG. 5D, the frame 200 is shown including a single localized force spring feature 216D disposed on a side of the first heat generating element 108A of the PCBA 100. As shown in FIG. 5D, the heat emitting surface 110A of the first heat generating element 108A is shown in thermal contact with the thermally conductive surface 524A of the first thermally conductive pad 520A. As described herein, the spring features 212 may bias the entire PCBA 100 in a direction toward the baseplate 516 of the package base 504 with or without any additional localized force spring features 216A-D. Additionally or alternatively, the single localized force spring features 216D disposed on side of the first heat generating element 108A of the PCBA 100 may provide an additional downward force (e.g., force acting in the negative Y-axis direction, etc.). For example, the lid contact knee 224 may contact the internal surface 536 of the package lid 532, causing the single localized force spring feature 216D to flex applying a force against the first heat generating element 108A and maintaining the heat emitting surface 110A in thermal contact with the thermally conductive surface 524A of the third thermally conductive pad 520A. In some embodiments, a TIM may be disposed between the heat emitting surface 110A and the thermally conductive surface 524A. In one embodiment, the thermally conductive surface 524A and/or the heat emitting surface 110A may include the TIM. The pressure applied by the single localized force spring feature 216D shown in FIG. 5D, may be fine-tuned via bending the feature 216D at one or more different angles and/or via including a built up feature, shim, or other interstitial mechanical element disposed between the lid contact knee 224 of the localized force spring feature 216D and the internal surface 536 of the package lid 532 (e.g., increasing the displacement of, and force applied by, the spring feature 216D, etc.).

As illustrated in FIGS. 5C and 5D, the heat generating elements 108A, 108C are biased in contact with the package base 504 via the various spring features 212, 216B-D, sandwiched between the package base 504 and the package lid 532. The biasing and constant contact pressure of the heat generating elements 108A, 108C against the thermally conductive pads 520A, 520C provides a thermally conductive path running from the heat generating elements 108A, 108C to the bottom 506 of the package 500, and vice versa. Attaching a cooling plate, or other cooling device, to the bottom 506 of the package 500 provides active and constant selective cooling of the electronic components of the PCBA 100, through this thermally conductive path running from an environment outside of the package 500 to an environment inside the package 500.

Figure 6:
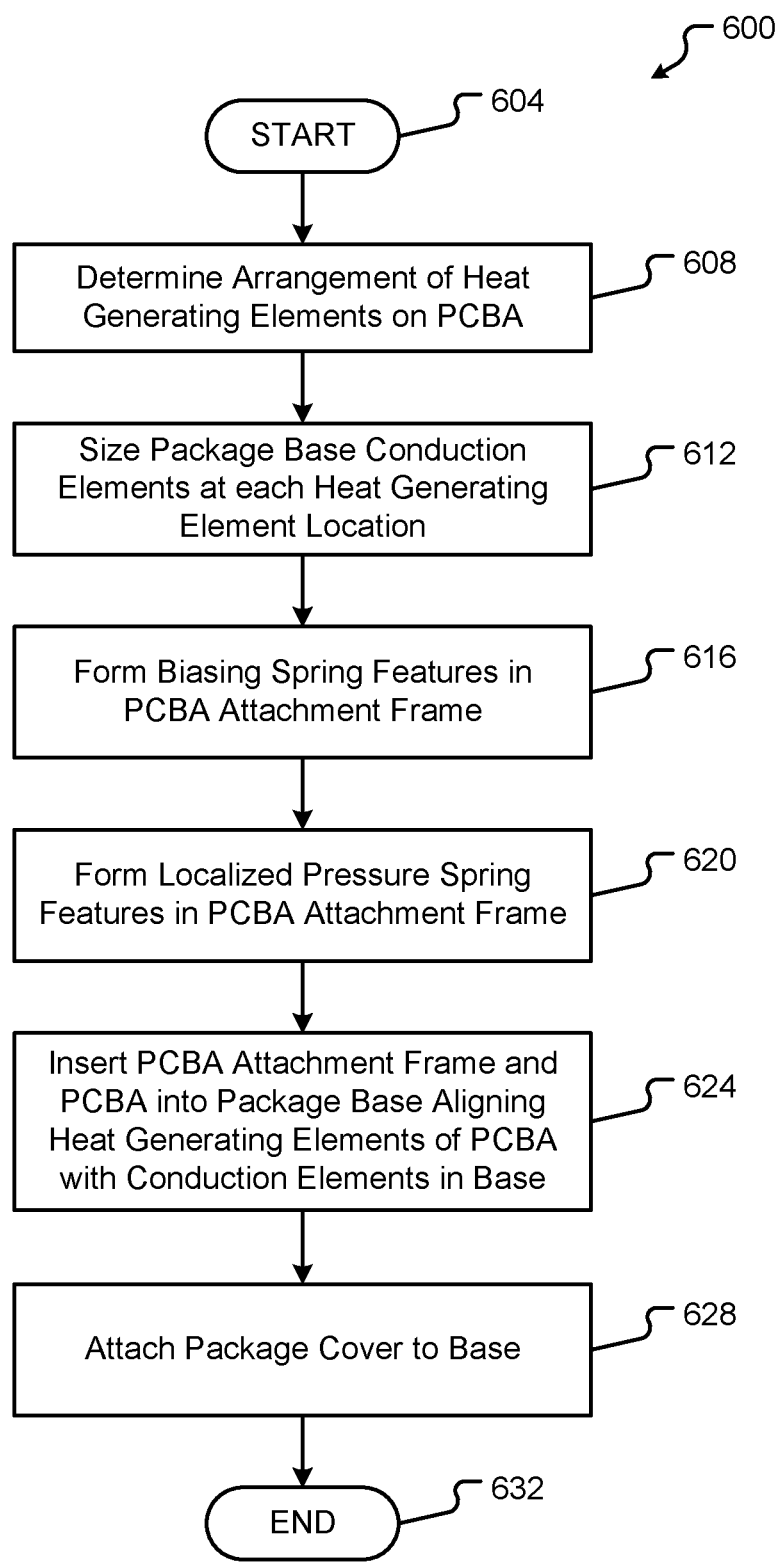
FIG. 6 is a flow diagram of a method for forming, assembling, and tuning the sealed processing system spring frame with attached electronics assembly into the sealed processing system package in accordance with embodiments of the present disclosure.

FIG. 6 is a flow diagram of a method 600 for forming, assembling, and tuning the sealed processing system spring frame 200 with attached electronics assembly 100 into the sealed processing system package 500 in accordance with embodiments of the present disclosure. While a general order for the steps of the method 600 is shown in FIG. 6, the method 600 can include more or fewer steps or can arrange the order of the steps differently than those shown in FIG. 6. Generally, the method 600 starts with a start operation 604 and ends with an end operation 632. The method 600 can be executed as a set of computer-executable instructions executed by an assembly machine (e.g., robotic assembly system, automation assembly system, computer aided drafting (CAD) machine, etc.) and encoded or stored on a computer readable medium. Hereinafter, the method 600 shall be explained with reference to the components, devices, assemblies, environments, etc. described in conjunction with FIGS. 1-5D.

The method 600 may begin at step 604 and continue by determining the arrangement of heat generating elements 108A-C on the PCBA 100 (step 608). Determining the arrangement of the heat generating elements 108A-C may include determining a position of each element 108A-C along the width, WS, and/or length, LS, of the PCBA 100 and/or PCB substrate 104.

Additionally or alternatively, step 608 may include determining a height for each heat generating element 108A-C on the PCBA 100 (e.g., extending from the first surface 106A and/or measured from the second surface 106B of the PCB substrate 104, etc.). The positions and heights for the heat generating elements 108A-C may be obtained automatically from CAD models, coordinate measuring machines (CMIVIs), and/or some other measurement system.

In some embodiments, the method 600 may continue by determining that various heights of each of the heat generating elements 108A-C may require different machined or formed conduction elements (e.g., the thermally conductive pads 520A-C, etc.)(step 612). These thermally conductive pads 520A-C may be designed to be machined or formed at heights to match, or substantially match, a mating PCBA 100 inserted into the package 500. For instance, the heights may be disposed in the package base 504 such that a thermally conductive surface 524A-C for each pad 520A-C may contact a heat emitting surface 100A-C of heat generating elements 108A-C disposed opposite the pads 520A-C.

Next, the method 600 may continue by forming the spring features 212, 216A-D in the frame 200 (steps 616, 620). In some embodiments, this step may include bending edges of the frame 200 to create the PCBA 100 spring features 212 (step 616). Additionally or alternatively, this step may include laser cutting a flat sheet metal substrate (e.g., prior to bending) at areas adjacent to the determined locations of the heat generating elements 108A-C, inside the mount area 204. These cuts may be formed on three sides of a portion of the material inside the mount area 204 (e.g., adjacent to the heat generating elements 108A-C of the PCBA 100). Once cut, the portions of the material surrounded on three sides by cuts may be bent at a non-zero angle in a direction away from the PCBA 100 mount surface 206B. These bent portions of material may form one or more of the localized force spring features 216A-D as previously described. In some embodiments, each of the localized force spring features 216A-D may be "tuned" by adjusting the bend angle and/or adjusting the displacement of the localized force spring features 216A-D when inserted into the package 500.

The method 600 may proceed by inserting the integrated package 400 (e.g., the frame 200 and mounted PCBA 100) into the package base 504 (step 624). In one embodiment, this step may include pressing and/or attaching the mount flanges 208A, 208B of the frame 200 to the mount surfaces 508A, 508B of the package base 508. In some embodiments, the mount flanges 208A, 208B may be elevated above the mount surfaces 508A, 508B of the package base 504 until the frame 200 is compressed, or clamped in place, by the cover or package lid 532.

Once, the integrated package 400 is aligned inside the package base 504 (e.g., where each heat generating element 108A-C is disposed in alignment with each thermally conductive pad 520A-C, etc.), the package lid 532 may be attached to the package base 504. As described above, the package lid 532 may be fastened, adhered, affixed, brazed, welded, and/or otherwise attached to the package base 504. It is an aspect of the present disclosure that the package lid 532 when attached to the package base 504 may hermetically seal the package 500 and, more specifically, seal the interior space of the package 500, including the frame 200 and PCBA 100, from an environment outside of the package 500. In some embodiments, (e.g., prior to attaching the package lid 532 to the package base 504) the connectors 116A, 116B of the PCBA 100 may be interconnected to the one or more interconnection features 528 disposed in the package lid 532 and/or the package base 504. This interconnection may provide a conductive path for one or more of communication and/or power between the inside of the sealed package 500 and the outside of the package 500.

In some embodiments, and prior to attaching the package lid 532, the inside space 512 of the package 500 may be filled with a material. The material may be a gas, a dielectric material, a thermally conductive material, an epoxy potting compound, etc., and/or combinations thereof. The material may provide protection of the components (e.g., electronic components, PCBA 100, etc.) inside the package 500. In one embodiment, the material may provide enhanced thermally conductive pathways between the various components of the PCBA 100 and the interior surfaces of the package base 504. The material may be inserted as a fluid that, when cured, hardens in the open spaces between the PCBA 100 and the interior surfaces (e.g., the baseplate 516 and the walls of the package base 504, etc.) of the package 500. The material can secure the components of the PCBA 100 in place inside the package 500, and relative to one another, providing enhanced shock resistance and protection from failures due to separation of components from the PCBA 100. In some embodiments, the material inserted may serve to prevent corrosion of the electronic components inside the package 500 (e.g., providing an inert reactive environment, etc.). Once filled and/or cured, the package lid 532 may be attached to the package base 504 sealing the frame 200 and PCBA 100 inside the package 500. The method 600 ends at step 632.

The exemplary systems and methods of this disclosure have been described in relation to electronics packaging and compliant frames for electronic components disposed in sealed packages. However, to avoid unnecessarily obscuring the present disclosure, the preceding description omits a number of known structures and devices. This omission is not to be construed as a limitation of the scope of the claimed disclosure. Specific details are set forth to provide an understanding of the present disclosure. It should, however, be appreciated that the present disclosure may be practiced in a variety of ways beyond the specific detail set forth herein.

A number of variations and modifications of the disclosure can be used. It would be possible to provide for some features of the disclosure without providing others. In some embodiments, the present disclosure provides an electrical interconnection device that can be used between any electrical source and destination. While the present disclosure describes connections between battery modules and corresponding management systems, embodiments of the present disclosure should not be so limited.

Although the present disclosure describes components and functions implemented in the embodiments with reference to particular standards and protocols, the disclosure is not limited to such standards and protocols. Other similar standards and protocols not mentioned herein are in existence and are considered to be included in the present disclosure. Moreover, the standards and protocols mentioned herein, and other similar standards and protocols not mentioned herein are periodically superseded by faster or more effective equivalents having essentially the same functions. Such replacement standards and protocols having the same functions are considered equivalents included in the present disclosure.

The present disclosure, in various embodiments, configurations, and aspects, includes components, methods, processes, systems and/or apparatus substantially as depicted and described herein, including various embodiments, subcombinations, and subsets thereof. Those of skill in the art will understand how to make and use the systems and methods disclosed herein after understanding the present disclosure. The present disclosure, in various embodiments, configurations, and aspects, includes providing devices and processes in the absence of items not depicted and/or described herein or in various embodiments, configurations, or aspects hereof, including in the absence of such items as may have been used in previous devices or processes, e.g., for improving performance, achieving ease, and/or reducing cost of implementation.

The foregoing discussion of the disclosure has been presented for purposes of illustration and description. The foregoing is not intended to limit the disclosure to the form or forms disclosed herein. In the foregoing Detailed Description for example, various features of the disclosure are grouped together in one or more embodiments, configurations, or aspects for the purpose of streamlining the disclosure. The features of the embodiments, configurations, or aspects of the disclosure may be combined in alternate embodiments, configurations, or aspects other than those discussed above. This method of disclosure is not to be interpreted as reflecting an intention that the claimed disclosure requires more features than are expressly recited in each claim. Rather, as the following claims reflect, inventive aspects lie in less than all features of a single foregoing disclosed embodiment, configuration, or aspect. Thus, the following claims are hereby incorporated into this Detailed Description, with each claim standing on its own as a separate preferred embodiment of the disclosure.

Moreover, though the description of the disclosure has included description of one or more embodiments, configurations, or aspects and certain variations and modifications, other variations, combinations, and modifications are within the scope of the disclosure, e.g., as may be within the skill and knowledge of those in the art, after understanding the present disclosure. It is intended to obtain rights, which include alternative embodiments, configurations, or aspects to the extent permitted, including alternate, interchangeable and/or equivalent structures, functions, ranges, or steps to those claimed, whether or not such alternate, interchangeable and/or equivalent structures, functions, ranges, or steps are disclosed herein, and without intending to publicly dedicate any patentable subject matter.

Embodiments include a compliant electronics assembly mount frame, comprising: a substrate including a substantially planar electronics assembly mount area, the substrate having a width and length; a first mount flange formed in the substrate and disposed along a first side of the width of the substrate; and a first spring feature integrally formed in the substrate between the first mount flange and a periphery of the substantially planar electronics assembly mount area, wherein the first spring feature mechanically couples the first mount flange with the substantially planar electronics assembly mount area via a first compliant connection.

Aspects of the above compliant electronics assembly mount frame further comprising: a second mount flange formed in the substrate and disposed along an opposite second side of the width of the substrate; and a second spring feature integrally formed in the substrate between the second mount flange and the periphery of the substantially planar electronics assembly mount area, wherein the second spring feature mechanically couples the second mount flange with the substantially planar electronics assembly mount area via a second compliant connection. Aspects of the above compliant electronics assembly mount frame include wherein the substrate and the first and second spring features are formed from a single sheet of metal, and wherein the first and second spring features are formed as a plurality of bends in the single sheet of metal. Aspects of the above compliant electronics assembly mount frame include wherein the first and second spring features are formed along the length of the substrate. Aspects of the above compliant electronics assembly mount frame include wherein the first and second mount flanges are substantially parallel to the substantially planar electronics assembly mount area. Aspects of the above compliant electronics assembly mount frame further comprising: a first localized force spring feature integrally formed from a first portion of material in the substrate and disposed inside the substantially planar electronics assembly mount area, wherein the first portion of material is bent in a direction outwardly away from the substantially planar electronics assembly mount area, and wherein the first portion of material is bent at a non-zero angle relative to a surface of the substantially planar electronics assembly mount area. Aspects of the above compliant electronics assembly mount frame include wherein the first localized force spring feature provides a controlled area of material in the substantially planar electronics assembly mount area along an edge and a first side of the first portion of material bent and a void of material along the edge and an opposite second side of the first portion of material bent.

Aspects of the above compliant electronics assembly mount frame include wherein a bend of the first localized force spring feature is disposed along the edge, and wherein the bend and the portion of material bent provide a bend-resistant reinforcement feature for the controlled area of material along a length of the edge. Aspects of the above compliant electronics assembly mount frame further comprising: a second localized force spring feature integrally formed from a second portion of material in the substrate and disposed inside the substantially planar electronics assembly mount area, wherein the second portion of material is bent in a direction outwardly away from the substantially planar electronics assembly mount area, and wherein the second portion of material is bent at a non-zero angle relative to a surface of the substantially planar electronics assembly mount area. Aspects of the above compliant electronics assembly mount frame include wherein the first and second localized force spring feature are disposed on opposites sides of the controlled area of material in the substantially planar electronics assembly mount area.

Embodiments include an integrated compliant electronics package, comprising: a frame comprising: a substrate including a substantially planar electronics assembly mount area, the substrate having a width and length; a first mount flange formed in the substrate and disposed along a first side of the width of the substrate; and a first spring feature integrally formed in the substrate between the first mount flange and a periphery of the substantially planar electronics assembly mount area, wherein the first spring feature mechanically couples the first mount flange with the substantially planar electronics assembly mount area via a first compliant connection; and a printed circuit board assembly (PCBA) attached to the substantially planar electronics assembly mount area on a first side of the substrate.

Aspects of the above integrated compliant electronics package include wherein the frame further comprises: a second mount flange formed in the substrate and disposed along an opposite second side of the width of the substrate; and a second spring feature integrally formed in the substrate between the second mount flange and the periphery of the substantially planar electronics assembly mount area, wherein the second spring feature mechanically couples the second mount flange with the substantially planar electronics assembly mount area via a second compliant connection. Aspects of the above integrated compliant electronics package further comprising: a package base comprising a baseplate and walls disposed at a periphery of the baseplate and extending outwardly from the baseplate, the walls including a mount surface offset from the baseplate, wherein the first and second mount flanges of the frame are attached to the mount surface of the package base. Aspects of the above integrated compliant electronics package include wherein the substrate and the first and second spring features are formed from a single sheet of metal, wherein the first and second spring features are formed as a plurality of bends in the single sheet of metal, and wherein the first and second spring features bias surfaces of the PCBA against the baseplate of the package base. Aspects of the above integrated compliant electronics package further comprising: a package lid having a peripheral shape substantially matching a peripheral shape of the walls or the mount surface of the package base, wherein the package lid is attached to the mount surface of the package base containing the frame and PCBA inside an enclosed space. Aspects of the above integrated compliant electronics package include wherein the frame further comprises: a first localized force spring feature integrally formed from a first portion of material in the substrate and disposed inside the substantially planar electronics assembly mount area, wherein the first portion of material is bent in a direction outwardly away from the substantially planar electronics assembly mount area, and wherein the first portion of material is bent at a non-zero angle relative to a surface of the substantially planar electronics assembly mount area. Aspects of the above integrated compliant electronics package include wherein the first localized force spring feature is disposed in an area adjacent to an area of the PCBA including at least one heat generating element, wherein an upper portion of the first localized force spring feature contacts an internal surface of the package lid under compression biasing a region of material in the substrate within the area of the PCBA including the at least one heat generating element in a direction toward the baseplate, and wherein a heat emitting surface of the at least one heat generating element is maintained in intimate contact with a thermally conductive surface in the baseplate via a spring force provided by the a first and second spring features and the first localized force spring feature. Aspects of the above integrated compliant electronics package include wherein the baseplate is made from a thermally conductive material, wherein the thermally conductive surface includes a thermal interface material disposed on a portion of the baseplate, wherein the package lid is made from a nonmetallic material, and wherein the PCBA is substantially shielded from electromagnetic and radio frequency interference via the metal frame disposed between the PCBA and the package lid.

Embodiments include a compliant printed circuit board assembly (PCBA) mount frame, comprising: a single metal sheet having a length and width and a PCBA mount area substantially disposed at a center of the single metal sheet, wherein the PCBA mount area is substantially planar and sized to receive a PCBA on a first side of the single metal sheet; a first suspension flange formed in the single metal sheet along a peripheral edge of the width of the single metal sheet; a second suspension flange formed in the single metal sheet along an opposite second peripheral edge of the width of the single metal sheet; a first spring feature integrally formed in the single metal sheet between the first suspension flange and a periphery of the PCBA mount area; and a second spring feature integrally formed in the single metal sheet between the second suspension flange and the periphery of the PCBA mount area, wherein the first and second suspension flanges are disposed substantially in a same plane, wherein the first and second spring features mechanically couple the first suspension flange with the PCBA mount area via a first and second compliant connections, respectively.

Aspects of the above compliant PCBA mount frame further comprising: at least one pressure tab integrally formed in the single metal sheet inside the PCBA mount area, wherein the at least one pressure tab is bent at a non-zero angle outwardly in a direction away from the first side of the single metal sheet, wherein the at least one pressure tab is shaped to direct applied compressive force along a length of the at least one pressure tab toward a portion of material in the PCBA mount area adjacent to the bend of the at least one pressure tab, and wherein the first and second compliant connections provide dimensional and thermal compliance along the width of the single metal sheet.

Any one or more of the aspects/embodiments as substantially disclosed herein.

Any one or more of the aspects/embodiments as substantially disclosed herein optionally in combination with any one or more other aspects/embodiments as substantially disclosed herein.

One or more means adapted to perform any one or more of the above aspects/embodiments as substantially disclosed herein.

The phrases "at least one," "one or more," "or," and "and/or" are open-ended expressions that are both conjunctive and disjunctive in operation. For example, each of the expressions "at least one of A, B and C," "at least one of A, B, or C," "one or more of A, B, and C," "one or more of A, B, or C," "A, B, and/or C," and "A, B, or C" means A alone, B alone, C alone, A and B together, A and C together, B and C together, or A, B and C together.

The term "a" or "an" entity refers to one or more of that entity. As such, the terms "a" (or "an"), "one or more," and "at least one" can be used interchangeably herein. It is also to be noted that the terms "comprising," "including," and "having" can be used interchangeably.

The term "automatic" and variations thereof, as used herein, refers to any process or operation, which is typically continuous or semi-continuous, done without material human input when the process or operation is performed. However, a process or operation can be automatic, even though performance of the process or operation uses material or immaterial human input, if the input is received before performance of the process or operation. Human input is deemed to be material if such input influences how the process or operation will be performed. Human input that consents to the performance of the process or operation is not deemed to be "material."

The terms "determine," "calculate," "compute," and variations thereof, as used herein, are used interchangeably and include any type of methodology, process, mathematical operation or technique.

What is claimed is:

1. A compliant electronics assembly mount frame, comprising:
   a substrate including a substantially planar electronics assembly mount area, the substrate having a width and length;
   a first mount flange formed in the substrate and disposed along a first side of the width of the substrate;
   a second mount flange formed in the substrate and disposed along an opposite second side of the width of the substrate;
   a first spring feature integrally formed in the substrate between the first mount flange and a periphery of the substantially planar electronics assembly mount area, wherein the first spring feature mechanically couples the first mount flange with the substantially planar electronics assembly mount area via a first compliant connection;
   a second spring feature integrally formed in the substrate between the second mount flange and the periphery of the substantially planar electronics assembly mount area, wherein the second spring feature mechanically couples the second mount flange with the substantially planar electronics assembly mount area via a second compliant connection; and
   a first localized force spring feature integrally formed from a first portion of material in the substrate and disposed inside the substantially planar electronics assembly mount area, wherein the first portion of material is bent in a direction outwardly away from the substantially planar electronics assembly mount area, and wherein the first portion of material is bent at a non-zero angle relative to a surface of the substantially planar electronics assembly mount area.

2. The compliant electronics assembly mount frame of claim 1, wherein the substrate and the first and second spring features are formed from a single sheet of metal, and wherein the first and second spring features are formed as a plurality of bends in the single sheet of metal.

3. The compliant electronics assembly mount frame of claim 2, wherein the first and second spring features are formed along the length of the substrate.

4. The compliant electronics assembly mount frame of claim 3, wherein the first and second mount flanges are substantially parallel to the substantially planar electronics assembly mount area.

5. The compliant electronics assembly mount frame of claim 4, wherein the first localized force spring feature provides a controlled area of material in the substantially planar electronics assembly mount area along an edge and a first side of the first portion of material bent and a void of material along the edge and an opposite second side of the first portion of material bent.

6. The compliant electronics assembly mount frame of claim 5, wherein a bend of the first localized force spring feature is disposed along the edge, and wherein the bend and the portion of material bent provide a bend-resistant reinforcement feature for the controlled area of material along a length of the edge.

7. The compliant electronics assembly mount frame of claim 6, further comprising:
a second localized force spring feature integrally formed from a second portion of material in the substrate and disposed inside the substantially planar electronics assembly mount area, wherein the second portion of material is bent in a direction outwardly away from the substantially planar electronics assembly mount area, and wherein the second portion of material is bent at a non-zero angle relative to a surface of the substantially planar electronics assembly mount area.

8. The compliant electronics assembly mount frame of claim 7, wherein the first and second localized force spring feature are disposed on opposites sides of the controlled area of material in the substantially planar electronics assembly mount area.

9. The compliant electronics assembly mount frame of claim 1, wherein the first localized force spring feature comprises a package lid contact knee bend disposed adjacent to an end of the first localized force spring feature at a point furthest from the substantially planar electronics assembly mount area.

10. An integrated compliant electronics package, comprising:
a frame comprising:
a substrate including a substantially planar electronics assembly mount area, the substrate having a width and length;
a first mount flange formed in the substrate and disposed along a first side of the width of the substrate;
a second mount flange formed in the substrate and disposed along an opposite second side of the width of the substrate;
a first spring feature integrally formed in the substrate between the first mount flange and a periphery of the substantially planar electronics assembly mount area, wherein the first spring feature mechanically couples the first mount flange with the substantially planar electronics assembly mount area via a first compliant connection;
a second spring feature integrally formed in the substrate between the second mount flange and the periphery of the substantially planar electronics assembly mount area, wherein the second spring feature mechanically couples the second mount flange with the substantially planar electronics assembly mount area via a second compliant connection; and
a first localized force spring feature integrally formed from a first portion of material in the substrate and disposed inside the substantially planar electronics assembly mount area, wherein the first portion of material is bent in a direction outwardly away from the substantially planar electronics assembly mount area, and wherein the first portion of material is bent at a non-zero angle relative to a surface of the substantially planar electronics assembly mount area; and
a printed circuit board assembly (PCBA) attached to the substantially planar electronics assembly mount area on a first side of the substrate.

11. The integrated compliant electronics package of claim 10, further comprising:
a package base comprising a baseplate and walls disposed at a periphery of the baseplate and extending outwardly from the baseplate, the walls including a mount surface offset from the baseplate, wherein the first and second mount flanges of the frame are attached to the mount surface of the package base.

12. The integrated compliant electronics package of claim 11, wherein the substrate and the first and second spring features are formed from a single sheet of metal, wherein the first and second spring features are formed as a plurality of bends in the single sheet of metal, and wherein the first and second spring features bias surfaces of the PCBA against the baseplate of the package base.

13. The integrated compliant electronics package of claim 12, further comprising:
a package lid having a peripheral shape substantially matching a peripheral shape of the walls or the mount surface of the package base, wherein the package lid is attached to the mount surface of the package base containing the frame and PCBA inside an enclosed space.

14. The integrated compliant electronics package of claim 13, wherein the first localized force spring feature is disposed in an area adjacent to an area of the PCBA including at least one heat generating element, wherein an upper portion of the first localized force spring feature contacts an internal surface of the package lid under compression biasing a region of material in the substrate within the area of the PCBA including the at least one heat generating element in a direction toward the baseplate, and wherein a heat emitting surface of the at least one heat generating element is maintained in intimate contact with a thermally conductive surface in the baseplate via a spring force provided by the a first and second spring features and the first localized force spring feature.

15. The integrated compliant electronics package of claim 14, wherein the baseplate is made from a thermally conductive material, wherein the thermally conductive surface includes a thermal interface material disposed on a portion of the baseplate, wherein the package lid is made from a nonmetallic material, and wherein the PCBA is substantially shielded from electromagnetic and radio frequency interference via the metal frame disposed between the PCBA and the package lid.

16. The integrated compliant electronics package of claim 14, wherein the internal surface of the package lid is a substantially planar surface offset from the package lid adjacent to the first localized force spring feature.

17. The integrated compliant electronics package of claim 11, wherein the baseplate comprises a plurality of thermally conductive pads formed at areas opposite heat generating elements of the PCBA.

18. The integrated compliant electronics package of claim 17, wherein the plurality of thermally conductive pads are formed at different heights from a surface of the baseplate.

19. A compliant printed circuit board assembly (PCBA) mount frame, comprising:
  a single metal sheet having a length and width and a PCBA mount area substantially disposed at a center of the single metal sheet, wherein the PCBA mount area is substantially planar and sized to receive a PCBA on a first side of the single metal sheet;
  a first suspension flange formed in the single metal sheet along a peripheral edge of the width of the single metal sheet;
  a second suspension flange formed in the single metal sheet along an opposite second peripheral edge of the width of the single metal sheet;
  a first spring feature integrally formed in the single metal sheet between the first suspension flange and a periphery of the PCBA mount area;
  a second spring feature integrally formed in the single metal sheet between the second suspension flange and the periphery of the PCBA mount area, wherein the first and second suspension flanges are disposed substantially in a same plane, wherein the first and second spring features mechanically couple the first suspension flange with the PCBA mount area via a first and second compliant connections, respectively; and
  at least one pressure tab integrally formed in the single metal sheet inside the PCBA mount area, wherein the at least one pressure tab is bent at a non-zero angle outwardly in a direction away from the first side of the single metal sheet, wherein the at least one pressure tab is shaped to direct applied compressive force along a length of the at least one pressure tab toward a portion of material in the PCBA mount area adjacent to the bend of the at least one pressure tab, and wherein the first and second compliant connections provide dimensional and thermal compliance along the width of the single metal sheet.

20. The compliant PCBA mount frame of claim 19, wherein the at least one pressure tab comprises a first pressure tab and a second pressure tab spaced apart from one another at the portion of material.

* * * * *